(12) United States Patent
Lin et al.

(10) Patent No.: US 8,008,136 B2
(45) Date of Patent: Aug. 30, 2011

(54) FULLY SILICIDED GATE STRUCTURE FOR FINFET DEVICES

(75) Inventors: Ming-Ren Lin, Cupertino, CA (US); Witold P. Maszara, Morgan Hill, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 263 days.

(21) Appl. No.: 11/379,435

(22) Filed: Apr. 20, 2006

(65) Prior Publication Data

US 2006/0177998 A1 Aug. 10, 2006

Related U.S. Application Data

(62) Division of application No. 10/653,226, filed on Sep. 3, 2003, now abandoned.

(51) Int. Cl.
*H01L 21/00* (2006.01)
*H01L 21/84* (2006.01)

(52) U.S. Cl. . 438/151; 438/156; 438/585; 257/E21.014; 257/E21.442; 257/E21.438; 257/E21.633

(58) Field of Classification Search .......... 257/270, 257/275, E21.632, E21.442; 438/585, 154, 438/151, 268
See application file for complete search history.

(56) References Cited

U.S. PATENT DOCUMENTS

| | | | |
|---|---|---|---|
| 6,342,410 B1 * | 1/2002 | Yu | 438/164 |
| 6,413,802 B1 | 7/2002 | Hu et al. | 438/151 |
| 6,562,718 B1 * | 5/2003 | Xiang et al. | 438/682 |
| 6,611,029 B1 * | 8/2003 | Ahmed et al. | 257/365 |
| 6,635,909 B2 * | 10/2003 | Clark et al. | 257/192 |
| 6,770,516 B2 * | 8/2004 | Wu et al. | 438/154 |
| 6,800,885 B1 * | 10/2004 | An et al. | 257/275 |
| 6,842,048 B2 * | 1/2005 | Krivokapic et al. | 326/112 |
| 6,846,734 B2 * | 1/2005 | Amos et al. | 438/592 |
| 6,853,020 B1 * | 2/2005 | Yu et al. | 257/270 |
| 6,855,990 B2 * | 2/2005 | Yeo et al. | 257/353 |
| 6,936,882 B1 * | 8/2005 | Ahmed et al. | 257/314 |
| 6,995,438 B1 * | 2/2006 | Ahmed et al. | 257/396 |
| 7,091,068 B1 * | 8/2006 | Ahmed et al. | 438/149 |
| 7,230,287 B2 * | 6/2007 | Anderson et al. | 257/213 |
| 7,358,121 B2 * | 4/2008 | Chau et al. | 438/149 |
| 7,537,985 B2 * | 5/2009 | Anderson et al. | 438/176 |
| 2003/0102518 A1 * | 6/2003 | Fried et al. | 257/401 |
| 2003/0113970 A1 * | 6/2003 | Fried et al. | 438/286 |
| 2003/0141525 A1 * | 7/2003 | Nowak | 257/288 |
| 2003/0151077 A1 * | 8/2003 | Mathew et al. | 257/250 |

(Continued)

OTHER PUBLICATIONS

Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner* — Matthew Landau
*Assistant Examiner* — Latanya N Crawford
(74) *Attorney, Agent, or Firm* — Harrity & Harrity, LLP

(57) ABSTRACT

A method may include forming a gate electrode over a fin structure, depositing a first metal layer on a top surface of the gate electrode, performing a first silicide process to convert a portion of the gate electrode into a metal-silicide compound, depositing a second metal layer on a top surface of the metal-silicide compound, and performing a second silicide process to form a fully-silicided gate electrode.

12 Claims, 13 Drawing Sheets

U.S. PATENT DOCUMENTS

| | | | |
|---|---|---|---|
| 2004/0038435 A1* | 2/2004 | Wieczorek et al. | 438/13 |
| 2004/0048424 A1* | 3/2004 | Wu et al. | 438/154 |
| 2004/0113171 A1* | 6/2004 | Chiu et al. | 257/119 |
| 2004/0217420 A1* | 11/2004 | Yeo et al. | 257/347 |
| 2004/0256647 A1* | 12/2004 | Lee et al. | 257/289 |
| 2005/0037558 A1* | 2/2005 | Gong et al. | 438/197 |

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Co-Pending U.S. Appl. No. 10/653,226, filed Sep. 3, 2003, entitled "Fully Silicided Gate Structure for Finfet Devices".

* cited by examiner

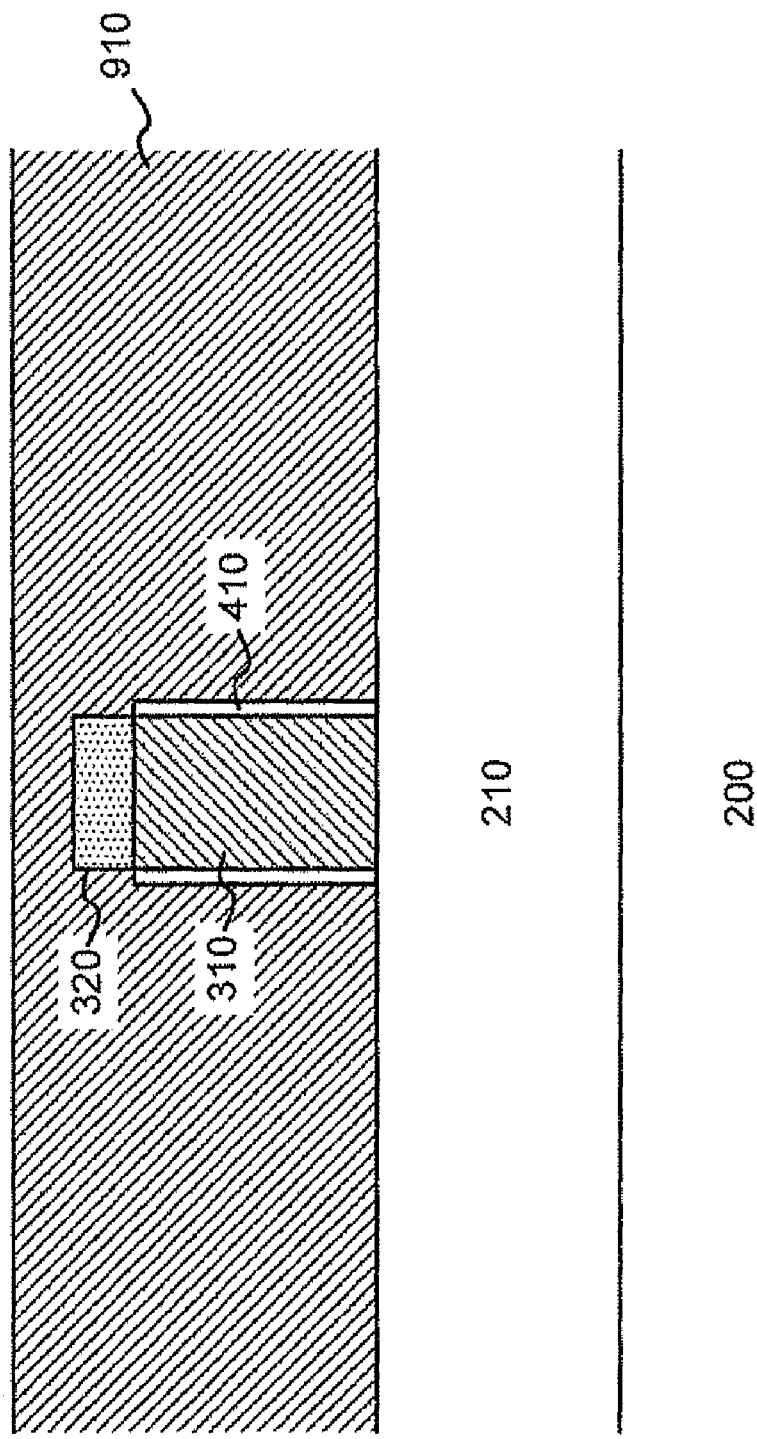

FULLY SILICIDED GATE STRUCTURE FOR FINFET DEVICES

RELATED APPLICATION

The present application is a divisional application of and claims priority to U.S. patent application Ser. No. 10/653,226, filed Sep. 3, 2003 now abandoned, the entire contents of which are incorporated by reference herein.

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention provide FinFET devices with fully silicided gate electrodes. The fully silicided gate electrodes cause a significant stress to be induced in the fin, thereby enhancing mobility in the fin. Moreover, conductivity of the gate electrodes is also enhanced.

In one implementation consistent with the principles of the invention, a method of manufacturing a semiconductor device is disclosed. The method includes forming a fin structure, where the fin structure includes first and second side surfaces; forming a dielectric layer on the first and second side surfaces of the fin structure; depositing a silicon layer over the fin structure; etching the silicon layer to form at least one gate electrode; performing a first silicide process to convert a portion of the silicon layer into a metal-silicide compound; and performing a second silicide operation to convert a remaining portion of the silicon layer into the metal-silicide compound.

In another implementation consistent with the principles of the invention, a method includes forming a fin structure, the fin structure including first and second side surfaces; depositing a silicon layer over the fin structure; etching the silicon layer to form at least one gate electrode; depositing a first metal layer on a top surface of the at least one gate electrode; performing a first silicide process to convert a portion of the silicon layer into a metal-silicide compound; depositing a second metal layer on a top surface of the metal-silicide compound; and performing a second silicide process to convert a remaining portion of the silicon layer into the metal-silicide compound.

In still another implementation consistent with the principles of the invention, a method includes forming a gate electrode over a fin structure; depositing a first metal layer on a top surface of the gate electrode; performing a first silicide process to convert a portion of the gate electrode into a metal-silicide compound; depositing a second metal layer on a top surface of the metal-silicide compound; and performing a second silicide process to form a fully-silicided gate electrode.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 2-9B illustrate exemplary views of a FinFET device fabricated according to the processing described in FIG. 1;

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide FinFET devices with fully silicided gate electrodes. The silicide in the gate electrodes causes a significant stress to be induced in the fin, resulting in enhanced mobility in the fin. Moreover, conductivity of the gate electrodes is also enhanced.

Exemplary Processing

Figure 1:
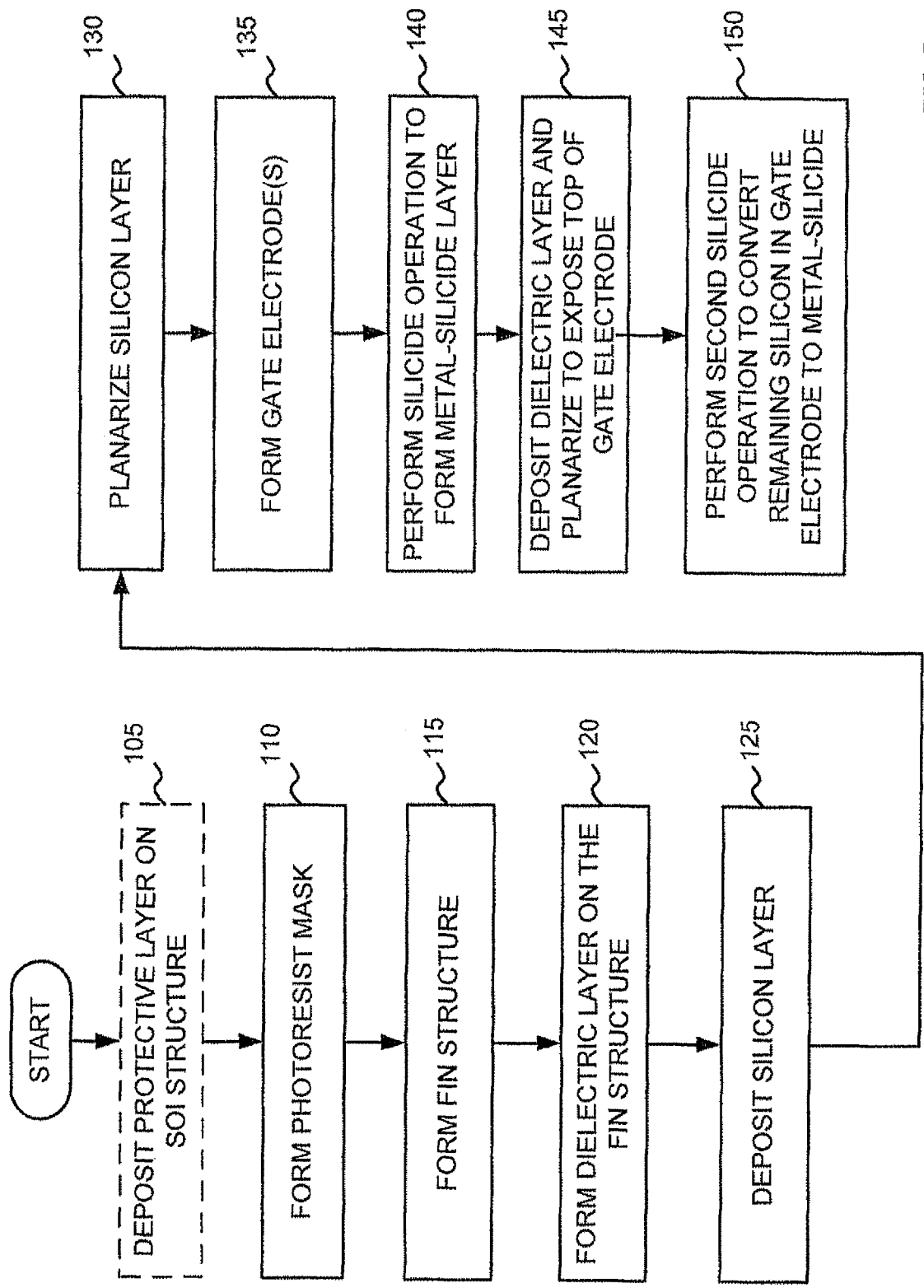
FIG. 1 illustrates an exemplary process for forming a FinFET device in an implementation consistent with the principles of the invention.

FIG. 1 illustrates an exemplary process for forming a FinFET device in an implementation consistent with the principles of the invention. FIGS. 2-9B illustrate exemplary views of a FinFET device fabricated according to the processing described in FIG. 1. The fabrication of one FinFET device will be described hereinafter. It will be appreciated, however, that the techniques described herein are equally applicable to forming more than one FinFET device.

Figure 2:
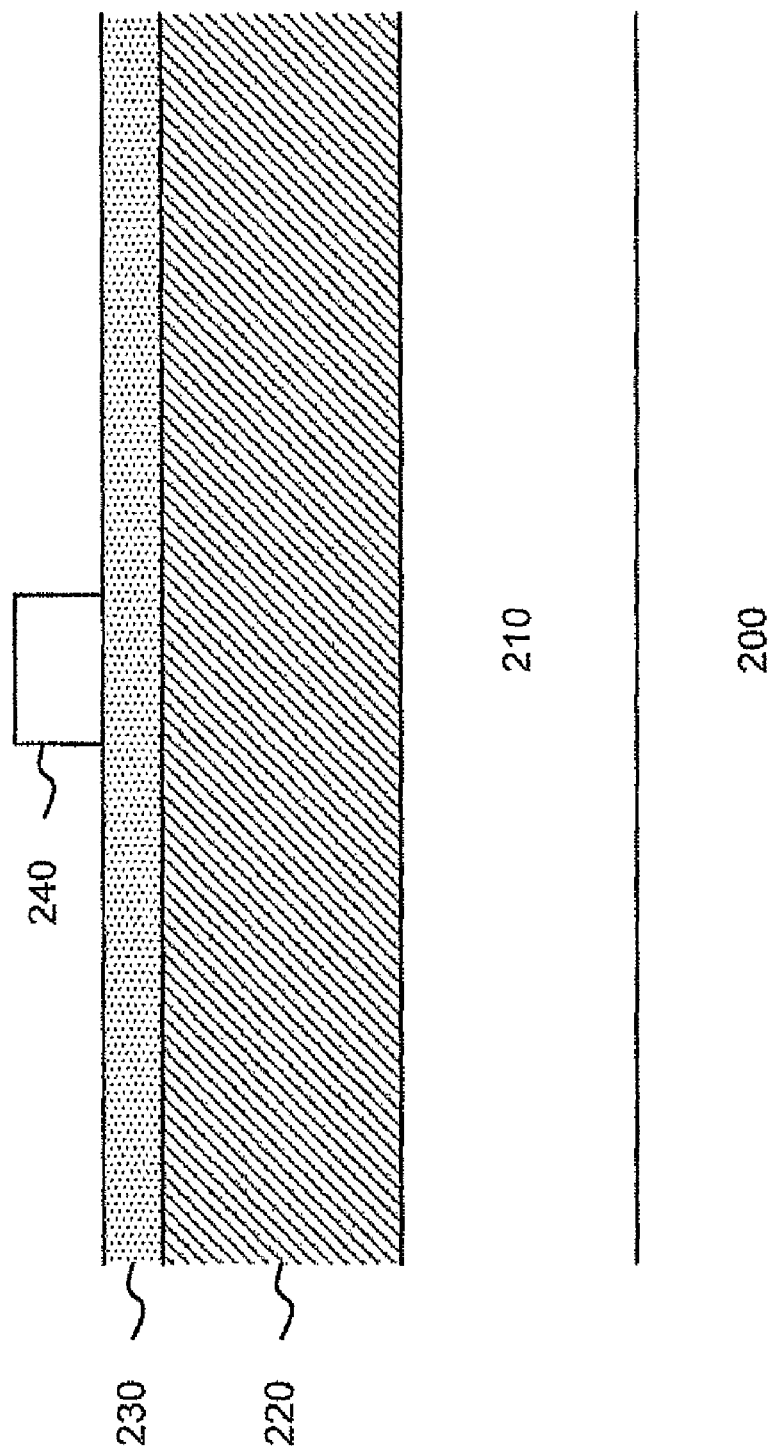

With reference to FIGS. 1 and 2, processing may begin with a semiconductor device that includes a silicon on insulator (SOI) structure. The SOI structure may include a silicon substrate 200, a buried oxide layer 210, and a silicon layer 220 on buried oxide layer 210. Buried oxide layer 210 and silicon layer 220 may be formed on substrate 200 in a conventional manner.

In an exemplary implementation, buried oxide layer 210 may include a silicon oxide and may have a thickness ranging from about 1500 Å to about 3000 Å. Silicon layer 220 may include monocrystalline or polycrystalline silicon having a thickness ranging from about 200 Å to about 1000 Å. Silicon layer 220 is used to form a fin for a FinFET device, as described in more detail below.

In alternative implementations consistent with the present invention, substrate 200 and layer 220 may comprise other semiconducting materials, such as germanium, or combinations of semiconducting materials, such as silicon-germanium. Buried oxide layer 210 may also include other dielectric materials.

A protective layer 230, such as a silicon oxide layer (e.g., $SiO_2$), may optionally be deposited on silicon layer 220 (act 105). Protective layer 230 may protect the subsequently formed fin during various etching processes. In one implementation, protective layer 230 may be deposited to a thickness ranging from about 200 Å to about 500 Å.

Next, a photoresist material may be deposited and patterned to form a photoresist mask 240 for subsequent processing (act 110). The photoresist may be deposited and patterned in any conventional manner. In an exemplary implementation, photoresist mask 240 may be trimmed to a width ranging from about 200 Å to about 500 Å.

Source and drain regions may also be formed in silicon layer 220. For example, silicon layer 220 may be patterned and etched in a conventional manner to form source and drain regions on buried oxide layer 210 adjacent the area in which the fin will be formed. Alternatively, the source/drain regions may be formed by depositing and patterning a layer of silicon, germanium or combination of silicon and germanium after the fin structure is formed.

Figure 3:
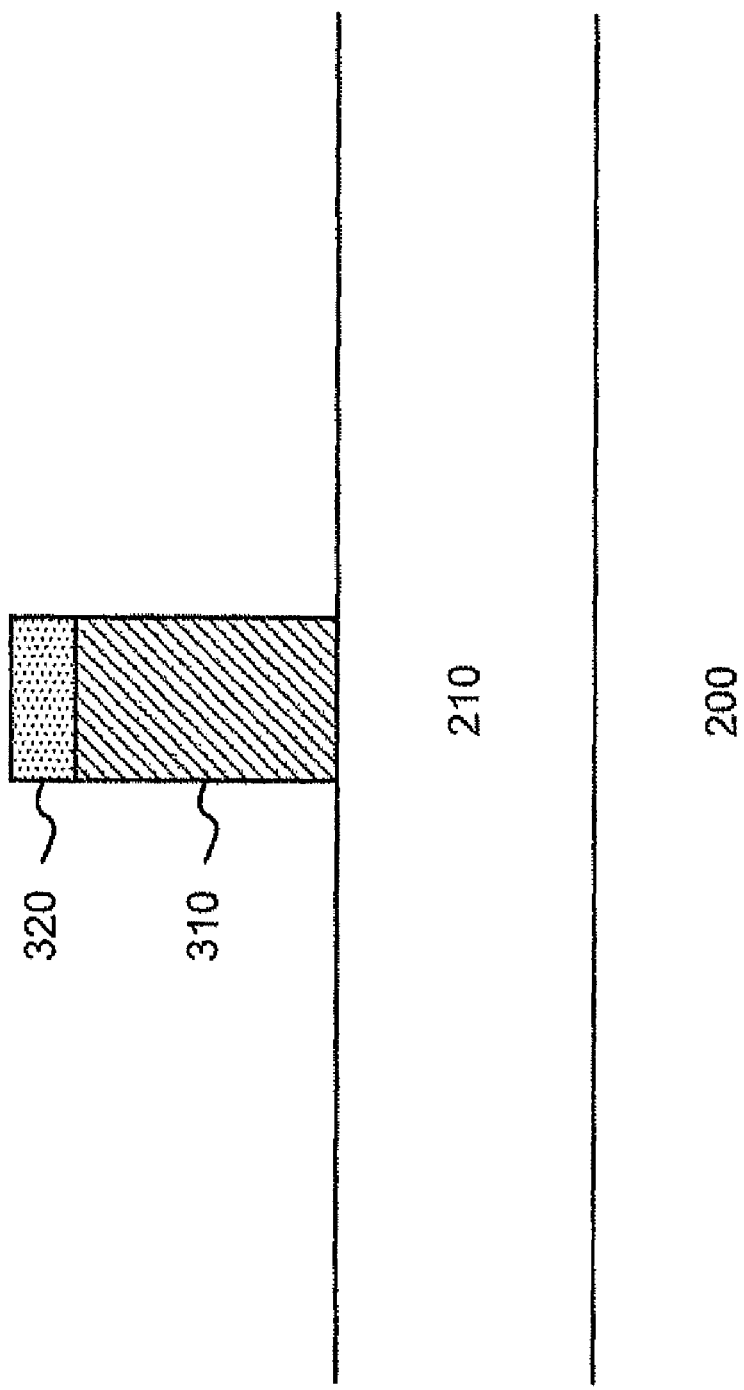

The semiconductor device may then be etched to form the fin structure (act 115). In an exemplary implementation, the portion of protective layer 230 and silicon layer 220 not located below photoresist mask 240 may be etched in a conventional manner with the etching terminating on buried oxide layer 210, thereby forming fin 310 having a protective cap 320, as illustrated in FIG. 3. Fin 310 comprises silicon and may be formed to approximately the same width as photoresist mask 240 (e.g., a width of about 200 Å to about 500 Å). As illustrated in FIG. 3, photoresist mask 240 may be removed after forming fin 310.

Figure 4:
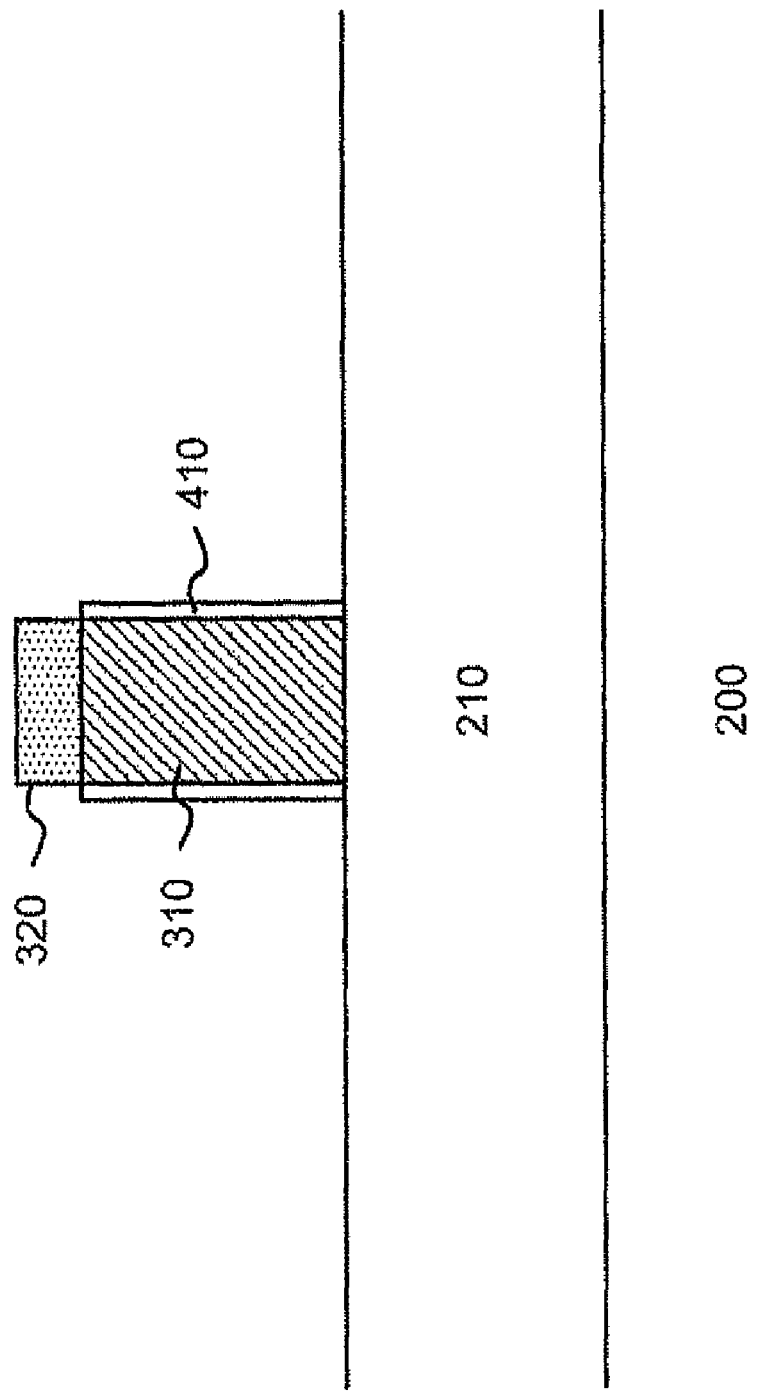

A dielectric layer may then be formed on fin 310 (act 120). For example, a thin oxide film 410 may be thermally grown on fin 310, as illustrated in FIG. 4. In an exemplary implementation, oxide layer 410 may be grown to a thickness of about 8 Å to about 50 Å and may be formed on the exposed silicon side surfaces of fin 310 to act as a gate dielectric layer.

Figure 5:
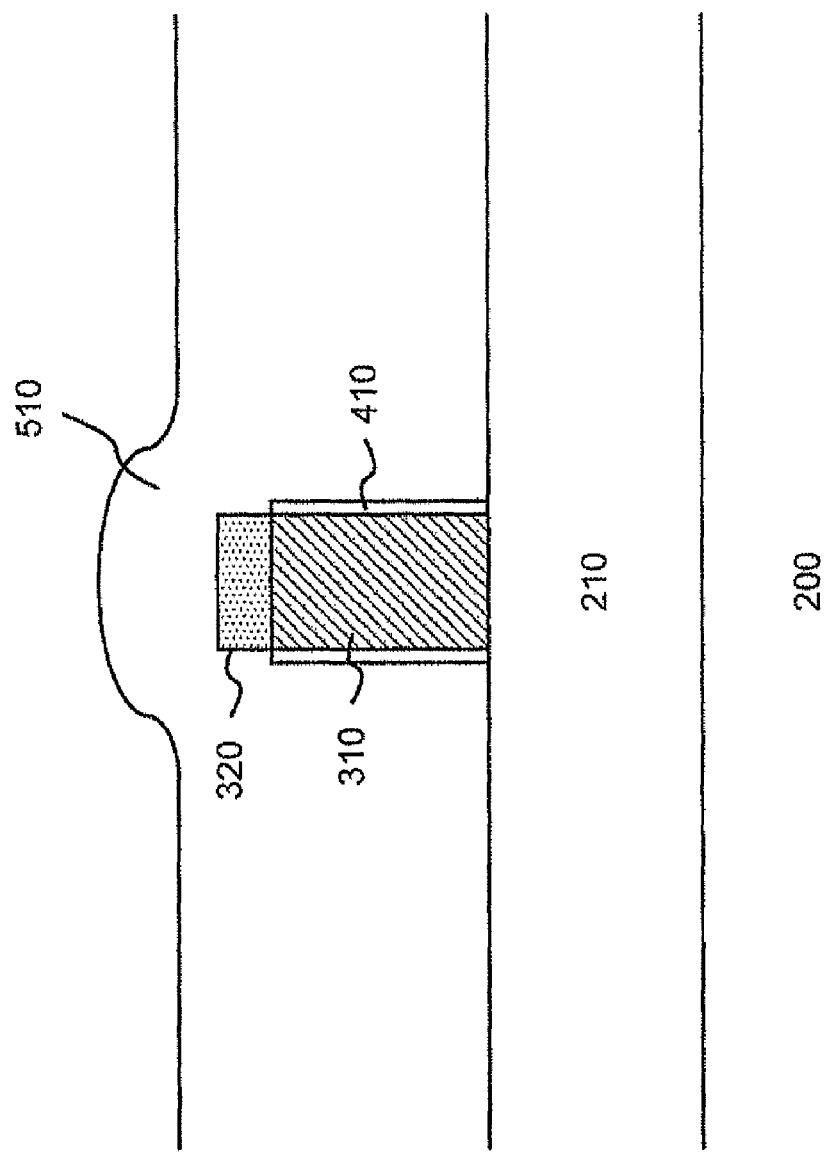

A silicon layer 510 may then be deposited over the semiconductor device, as illustrated in FIG. 5 (act 125). Silicon layer 510 may comprise the gate material for the subsequently formed gate electrode. In an exemplary implementation, silicon layer 510 may include polysilicon deposited using conventional chemical vapor deposition (CVD) to a thickness ranging from about 200 Å to about 2000 Å. Alternatively, other semiconducting materials, such as germanium or combinations of silicon and germanium, may be used as the gate material.

Figure 6:
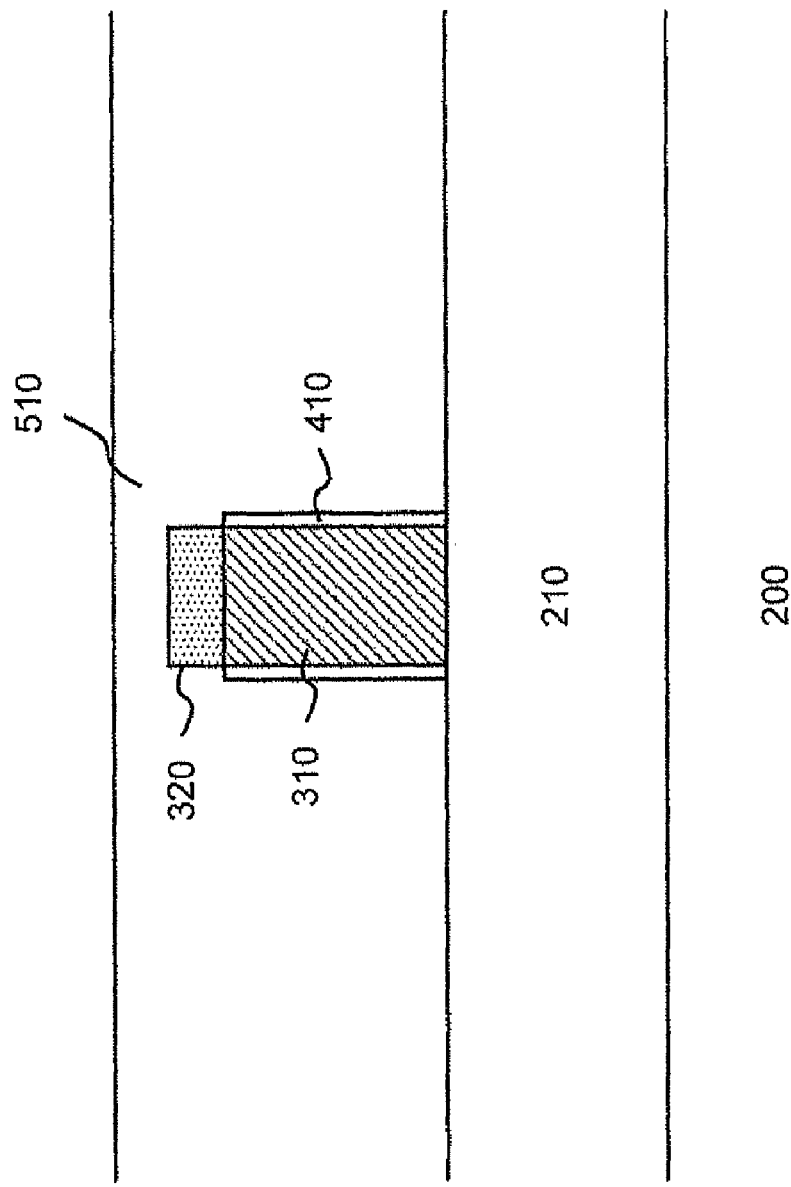
Figure 7:
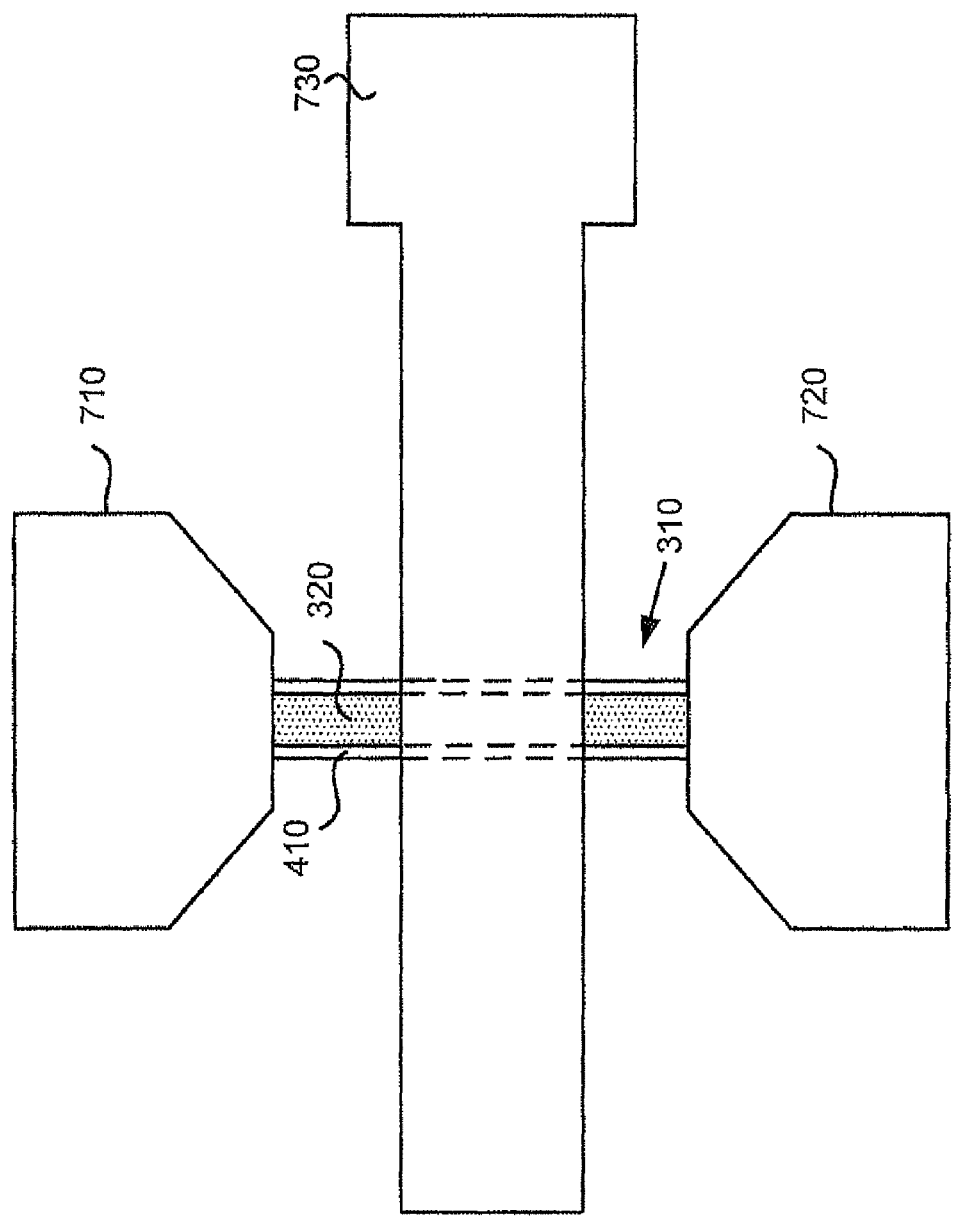

The semiconductor device may be planarized (act 130). For example, a chemical-mechanical polishing (CMP) may be performed to planarize the gate material (i.e., silicon layer 510), as illustrated in FIG. 6. Silicon layer 510 may then be patterned and etched to form one or more gate electrodes (act 135). Layer 320 is used to protect polysilicon during the polysilicon masking and etching process to expose the source-drain silicon areas. FIG. 7 illustrates an exemplary top view of the semiconductor device after a gate electrode is formed. As illustrated, the semiconductor device includes fin 310, source and drain regions 710 and 720, and gate electrode 730.

A silicide process may then be performed (act 140). A metal layer may be deposited over source/drain regions 710 and 720 and gate electrode 730. In an exemplary implementation, the metal layer may include nickel, cobalt, or another metal, and may be deposited to a thickness ranging from about 50 Å to about 500 Å. A thermal annealing may then be performed to form a metal-silicide layer (act 140). During the annealing, the metal may react with the silicon in source/drain regions 710 and 720 and gate electrode 730 to form a metal-silicide compound, such as NiSi or $CoSi_2$, based on the particular metal layer deposited. The thickness of the metal-silicide layer may range from about 50 Å to about 700 Å.

Figure 8:
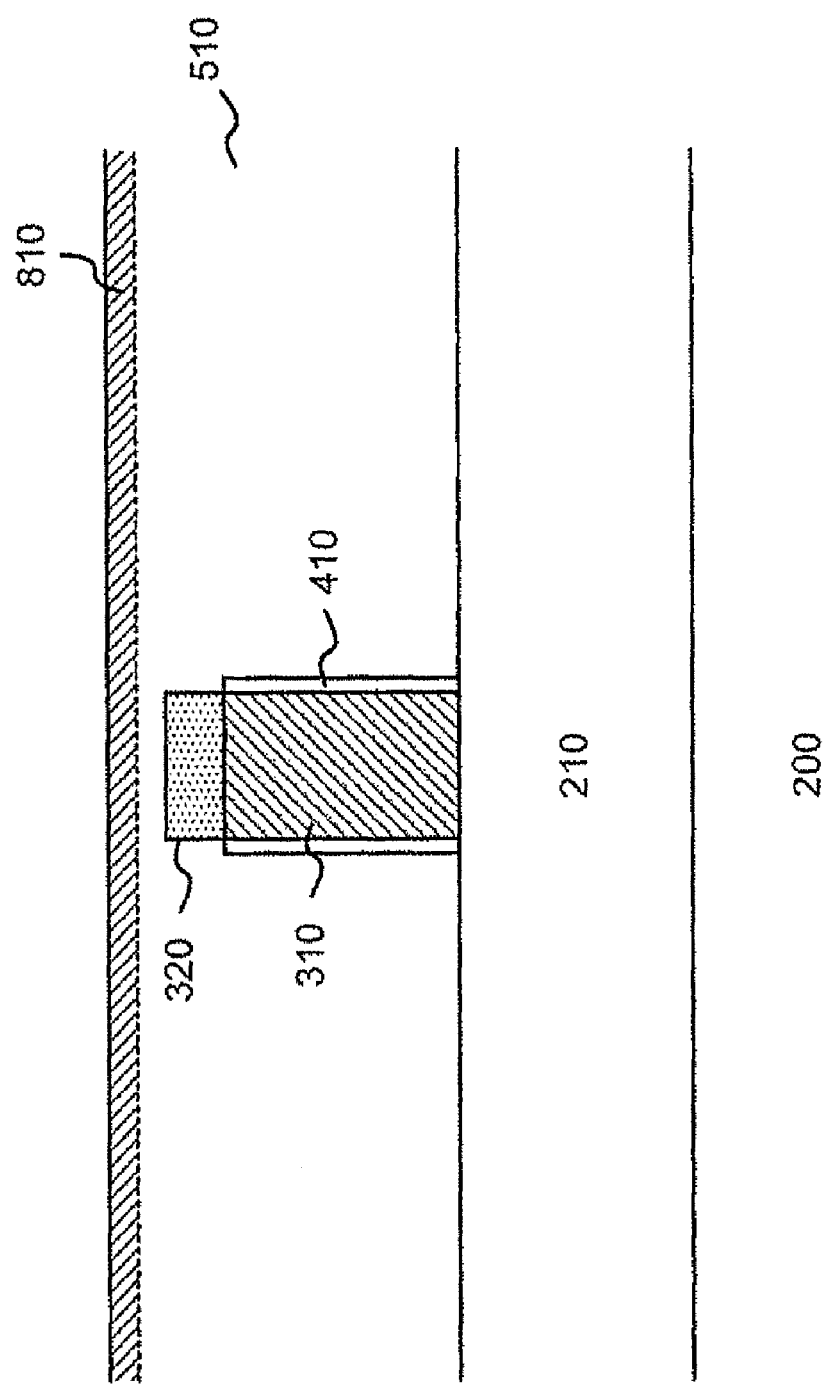

Next, a dielectric layer may be deposited over the semiconductor device to provide protection during subsequent processing (act 145). In an exemplary implementation, the dielectric layer may include a tetraethyl orthosilicate (TEOS) compound and may be deposited to a thickness ranging from about 200 Å to 3000 Å. The dielectric layer may then be planarized to expose metal-silicide 810 on the upper surface of gate electrode 730, as illustrated in FIG. 8 (act 145). For example, a CMP may be performed to planarize the dielectric layer to expose the upper surface of metal-silicide layer 810 located on the upper surface of gate electrode 730. The remaining portions of the semiconductor device (e.g., fin 310 and source/drain regions 710 and 720) may remain covered by the dielectric layer. As illustrated in FIG. 8, the upper surface of silicon layer 510 includes metal-silicide layer 810 formed as a result of the silicide process described above.

A second silicide process may then be performed (act 150). A metal layer may be deposited over metal-silicide layer 810. In an exemplary implementation, the metal layer may include nickel, cobalt, and titanium, and may be deposited to a thickness ranging from about 50 Å to about 2000 Å. A thermal annealing may then be performed to convert the remaining portion of silicon layer 510 into a metal-silicide 910, as illustrated in FIG. 9A (act 150). During the annealing, the metal may react with the silicon in silicon layer 510 to form a metal-silicide compound, such as NiSi or $CoSi_2$, based on the particular metal layer deposited.

Figure 9B:
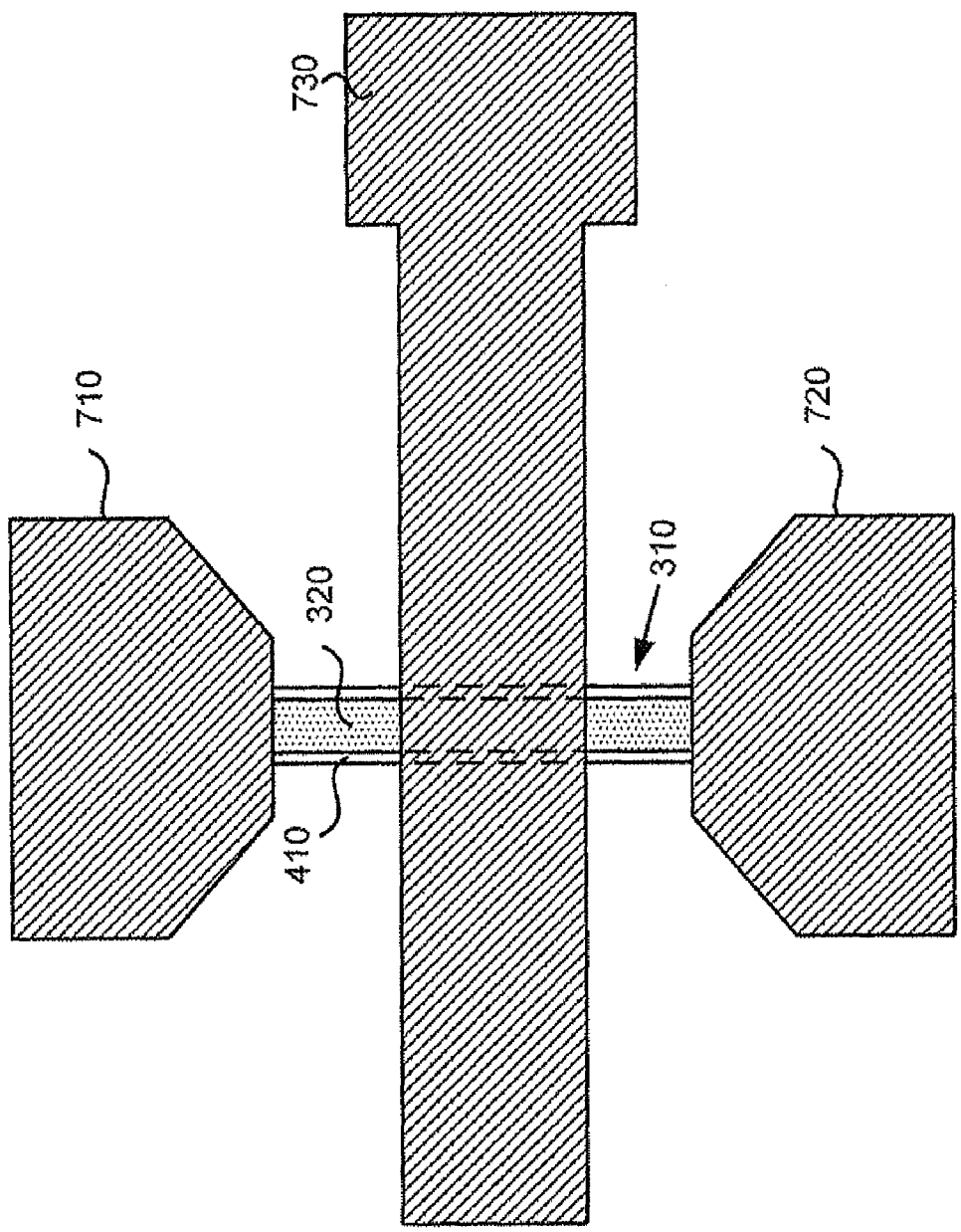

FIG. 9B illustrates an exemplary top view of the semiconductor device after the second silicide process has been performed. Gate electrode 730 may be fully silicided. That is, all or nearly all of the silicon in silicon layer 510 has been converted to a metal-silicide compound. Source and drain regions 710 and 720 may include a thin metal-silicide layer, similar to metal-silicide layer 810 described above.

The present invention has been described above as forming a single gate electrode. It should be understood that implementations consistent with the present invention may be used to form more than one gate electrode (e.g., two gate electrodes), based on the particular circuit requirements.

Thus, in accordance with the principles of the invention, a fully silicided gate electrode is formed. The metal-silicide in the gate electrode causes a stress (or strain) on the channel (i.e., the fin structure) thereby enhancing mobility in the channel. Moreover, the conductivity of the gate electrode is enhanced.

Other Implementations

Figure 10:
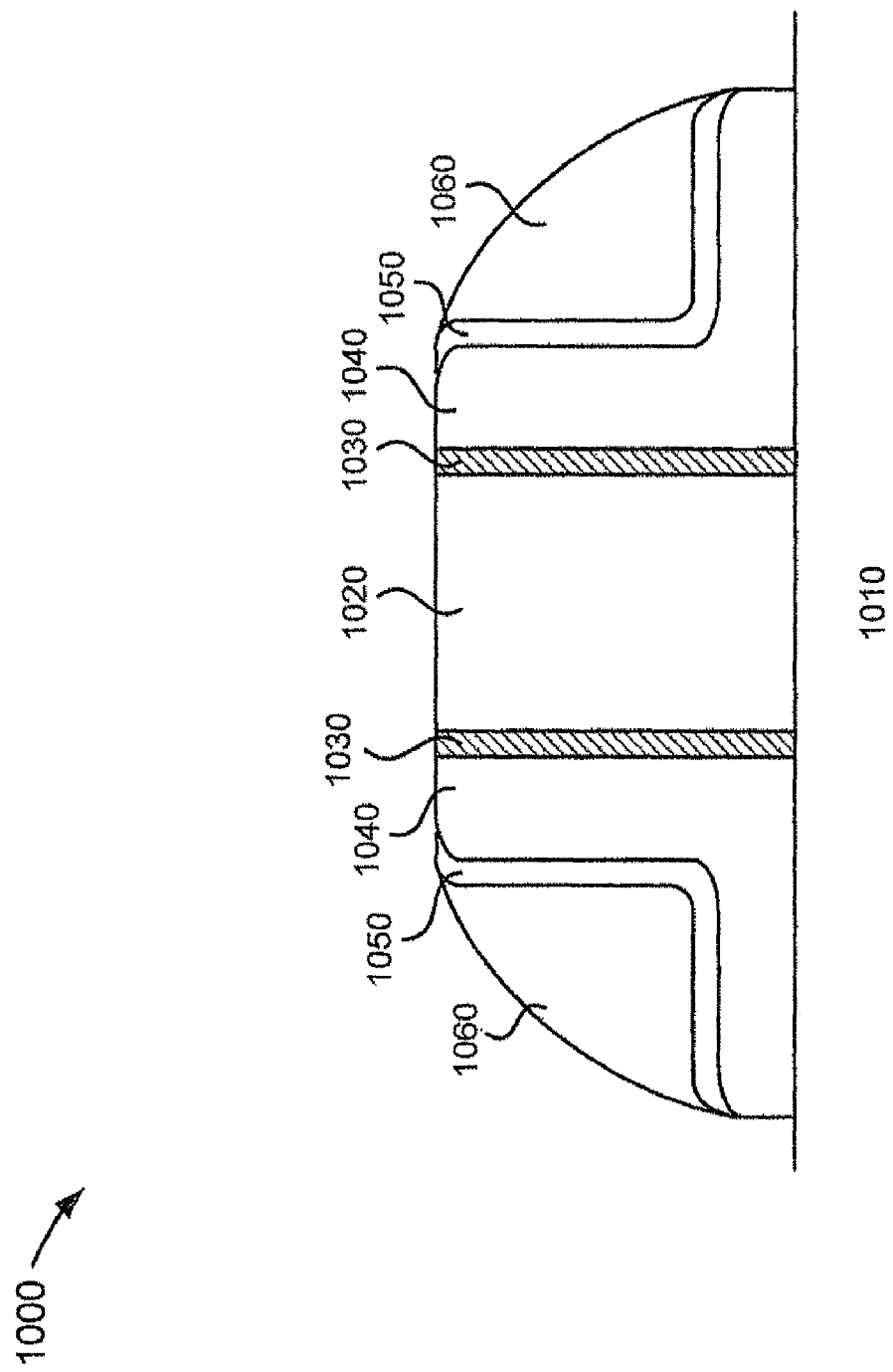
FIG. 10 illustrates an exemplary view of a FinFET device that may be used for flash memory applications in an alternative implementation consistent with the principles of the invention.

In another implementation, it may be desirable to form an L-shaped floating gate for flash memory applications. FIG. 10 illustrates an exemplary view of a FinFET device 1000 that may be used for flash memory applications in an alternative implementation consistent with the principles of the invention. As illustrated, FinFET device 1000 may include an oxide layer 1010 formed on a substrate (not shown). A fin structure 1020 may be formed on oxide layer 1010 in a conventional manner. In one implementation, fin structure 1020 may comprise monocrystalline or polycrystalline silicon.

An oxide layer 1030 may be formed on the side surfaces of fin structure 1020. An L-shaped floating gate 1040 may then be formed adjacent oxide layer 1030 on opposite sides of fin structure 1020. In one implementation, L-shaped floating gates 1040 may comprise polysilicon or other gate materials. An inter-poly dielectric material 1050 may be formed on L-shaped floating gates 1040. In one implementation, inter-poly dielectric 1050 may comprise an oxide.

Control gates 1060 may then be formed on inter-poly dielectric 1050. In one implementation, control gates 1060 may comprise polysilicon or other gate materials. Accordingly, a FinFET device 1000 may be formed that includes an L-shaped floating gate for flash memory applications.

Figure 11:
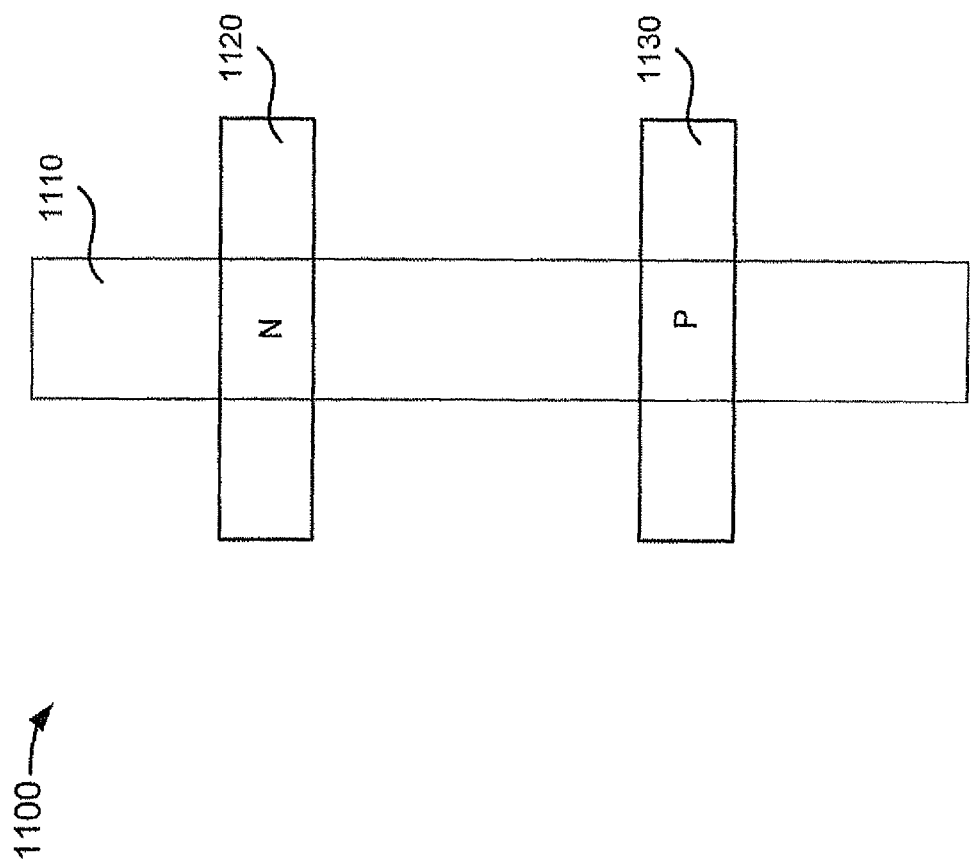
FIG. 11 illustrates a conventional FinFET design.

In another implementation, mobility may be improved via a tilted FinFET device layout. FIG. 11 illustrates a conventional FinFET design 1100. As illustrated, a gate 1110 may be formed in a substantially rectangular manner. An N-channel device 1120 and a P-channel device 1130 may be formed such that the N-channel device 1120 and P-channel device 1130 are substantially parallel to each other.

Figure 12:
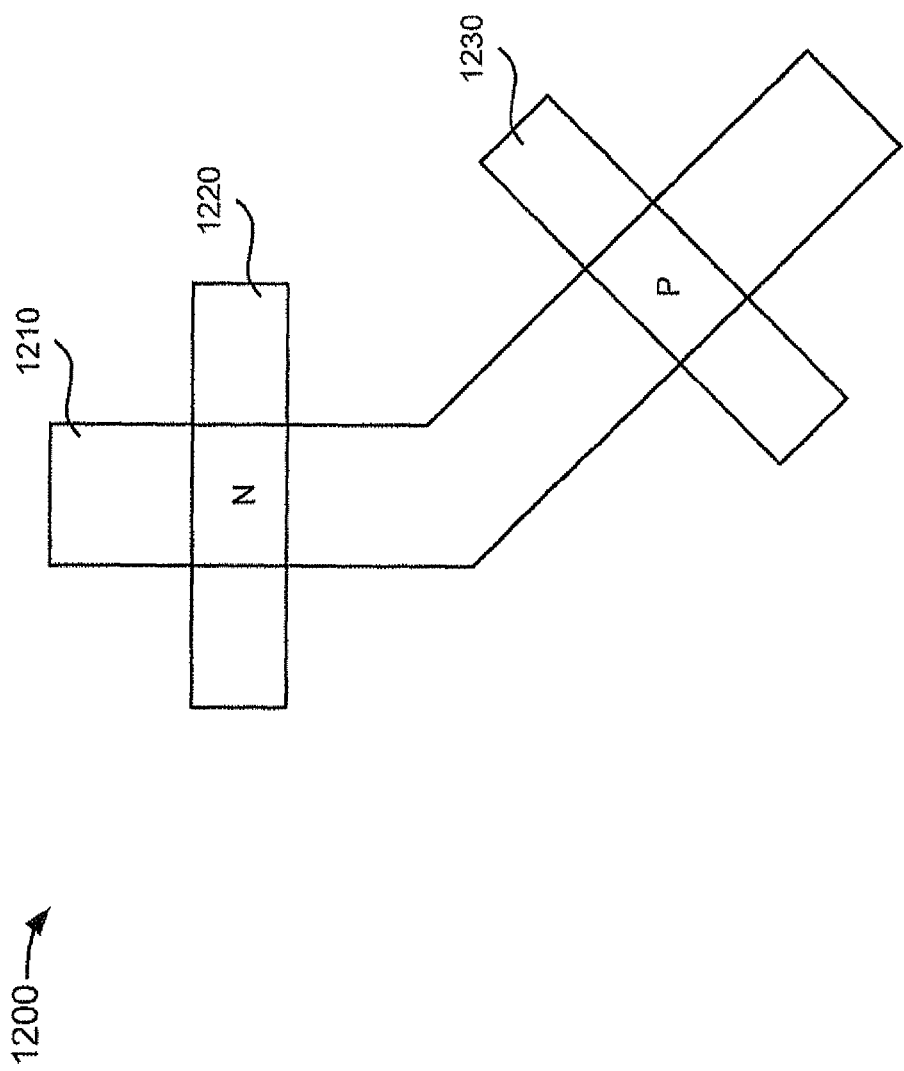
FIG. 12 illustrates an exemplary tilted FinFET design in an alternative implementation consistent with the principles of the invention.

Mobility for carriers is dependent on silicon crystal orientation. Therefore, to improve mobility, the orientation of the N-channel device may be varied from that of the P-channel device. FIG. 12 illustrates an exemplary tilted FinFET design 1200 in an alternative implementation consistent with the principles of the invention. As illustrated, a gate 1210 may be formed such that the orientation of the N-channel device 1220 may be different than the orientation of the P-channel device 1230. The difference in orientation may be 45° or other angles to optimize mobility in the N-channel and P-channel devices.

CONCLUSION

Implementations consistent with the principles of the invention provide FinFET devices with fully silicided gate electrodes. The silicide in the gate electrodes causes a significant stress to be induced in the fin structure. In this manner, mobility in the fin structure can be enhanced. Moreover, conductivity of the gate electrodes is also enhanced.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A method of manufacturing a semiconductor device, comprising:
    forming source and drain regions in a first silicon layer of the semiconductor device;
    forming a fin structure, the fin structure including first and second side surfaces;
    forming a first dielectric layer on the first and second side surfaces of the fin structure;
    forming a protective layer on a top surface of the fin structure;
    depositing a second silicon layer over the fin structure;
    etching the second silicon layer to form at least one gate electrode;
    performing a first silicide process to convert a portion of the first and second silicon layers into a metal-silicide compound that ranges in thickness from 50 Å to 700 Å; and
    depositing, after performing the first silicide process, a second dielectric layer over the device;
    planarizing the second dielectric layer to expose the metal-silicide compound of the gate electrode, without exposing the source and drain regions;
    performing a second silicide process to convert a remaining portion of the second silicon layer into the metal-silicide compound to form a fully-silicided gate electrode,
    where performing the second silicide process includes depositing a metal layer over the metal-silicide compound, of the gate electrode, that results from performing the first silicide process,
    where the protective layer protects the fin structure from the second silicide process,
    where the second silicide process is separate from the first silicide process, and
    where the fully-silicided gate electrode causes stress on the fin structure to enhance mobility in the fin structure.

2. The method of claim 1, where the second silicon layer includes a polysilicon.

3. The method of claim 1, where the metal-silicide compound comprises one of nickel, cobalt, or titanium.

4. The method of claim 1, where depositing the second silicon layer over the fin structure includes:
    depositing polysilicon to a thickness ranging from about 200 Å to about 2000 Å.

5. A method comprising:
    etching a first silicon layer to form source and drain regions;
    forming a fin structure, the fin structure including first and second side surfaces;
    depositing a second silicon layer over the fin structure;

etching the second silicon layer to form at least one gate electrode;

depositing a first metal layer on a top surface of the at least one gate electrode and the source and drain regions;

performing a first silicide process to convert a portion of the first and second silicon layers into a metal-silicide compound that ranges in thickness from 50 Å to 700 Å;

depositing, after performing the first silicide process, a dielectric layer over the gate electrode and the source and drain regions;

planarizing the dielectric layer to expose the metal-silicide compound of the gate electrode, without exposing the source and drain regions;

depositing a second metal layer on a top surface of the metal-silicide compound of the gate electrode; and performing a second silicide process after depositing the second metal layer to convert a remaining portion of the second silicon layer into the metal-silicide compound to form a fully-silicided gate electrode, where the fully-silicided gate electrode causes stress on the fin structure to enhance mobility in the fin structure.

6. The method of claim 5, where the second silicon layer includes a polysilicon.

7. The method of claim 5, where the metal-silicide compound comprises one of nickel, cobalt, or titanium.

8. The method of claim 5, where the depositing the second silicon layer over the fin structure includes:

depositing polysilicon to a thickness ranging from about 200 Å to about 2000 Å.

9. The method of claim 5, where depositing the dielectric layer includes:

forming the dielectric layer to a thickness ranging from about 8 Å to about 50 Å.

10. A method comprising:

forming a gate electrode over a fin structure;

forming source and drain regions at opposite ends of the fin structure;

depositing a first metal layer on a top surface of the gate electrode;

performing a first silicide process to convert a portion of the gate electrode, the source region, and the drain region into a metal-silicide compound;

depositing, after performing the first silicide process, a dielectric layer over the gate electrode, the source region, and the drain region;

planarizing the delectric layer to expose the metal-silicide compound of the gate electrode, without exposing the source and drain regions;

depositing a second metal layer on a top surface of the metal-silicide compound of the gate electrode; and performing a second silicide process after depositing a second metal layer to form a fully-silicided gate electrode, where the fully-silicided gate electrode causes stress on the fin structure to enhance mobility.

11. The method of claim 10, where the metal layer includes at least one of nickel, cobalt, or titanium.

12. The method of claim 10, where converting the portion of the gate electrode, the source region, and the drain region into the metal-silicide compound comprises converting the portion of the gate electrode, the source region, and the drain region into the metal-silicide compound that ranges in thickness from 50 Å to 700 Å.

* * * * *